US006870359B1

(12) United States Patent
Sekel

(10) Patent No.: US 6,870,359 B1
(45) Date of Patent: Mar. 22, 2005

(54) SELF-CALIBRATING ELECTRICAL TEST PROBE

(75) Inventor: Stephen Mark Sekel, Camas, WA (US)

(73) Assignee: Le Croy Corporation, Chestnut Ridge, NY (US)

( * ) Notice: Subject to any disclaimer, the term of this patent is extended or adjusted under 35 U.S.C. 154(b) by 11 days.

(21) Appl. No.: 10/321,422

(22) Filed: Dec. 16, 2002

Related U.S. Application Data

(60) Provisional application No. 60/340,496, filed on Dec. 14, 2001.

(51) Int. Cl.$^7$ .............................................. G01R 31/00
(52) U.S. Cl. .................... 324/158.1; 324/73.1
(58) Field of Search .......................... 324/121 R, 158.1, 324/74, 130, 115, 754–762, 72.5; 702/85, 90–91

(56) References Cited

U.S. PATENT DOCUMENTS

| | | | | |
|---|---|---|---|---|
| 4,364,027 A | * | 12/1982 | Murooka | 341/120 |
| 4,743,844 A | * | 5/1988 | Odenheimer et al. | 324/121 R |
| 5,235,268 A | * | 8/1993 | Harthcock | 324/115 |
| 5,248,933 A | * | 9/1993 | Venditti | 324/74 |
| 5,262,716 A | * | 11/1993 | Gregory et al. | 324/754 |
| 5,920,187 A | | 7/1999 | Cosgrove et al. | |
| 6,351,112 B1 | | 2/2002 | Felps et al. | |

OTHER PUBLICATIONS

TEKTRONIX, User Manual: TDS 520A, 524A, 540A, & 544A Digitizing Oscilloscopes, 1993, pp. 1–6, 2–4, 3–104 to 3–111, and 3–138–3–139.

* cited by examiner

*Primary Examiner*—Vinh P. Nguyen
(74) *Attorney, Agent, or Firm*—Law Office of Karen Dana Oster, LLC

(57) ABSTRACT

A self-calibrating test probe system of the present invention does not require probing head removal and replacement. Using the system of the present invention, the test probe and/or the entire system (including a testing instrument) may be calibrated or may self-calibrate while the probing head remains connected to an electrical component under test. The self-calibrating electrical testing probe system includes calibration circuitry including at least one input resistor, at least one relay, and at least one known calibration reference signal. If the test probe is an active test probe, the calibration circuitry may also include at least one amplifier. Each relay has a first position that provides signal access to a testing signal from an electrical component under test and a second position that provides signal access to the known calibration reference signal. Using the present invention, the error of the test probe and/or system is determined and compensated. Exemplary methods by which error compensation may be provided includes, for example, amplifying the testing signal, creating a correction table of correction values and adding an appropriate value from the correction table, or mathematically compensating.

37 Claims, 12 Drawing Sheets

SELF-CALIBRATING ELECTRICAL TEST PROBE

The present application is a nonprovisional of U.S. Provisional Patent Application Ser. No. 60/340,496, filed Dec. 14, 2001. The present application is based on and claims priority from this provisional application, the disclosure of which is hereby incorporated herein by reference.

BACKGROUND OF INVENTION

The present invention relates generally to electrical test probes for making contact between electrical components and testing instruments and, more specifically to a self-calibrating differential electrical testing probe.

An electrical test probe 18 generally consists of a probing head 20, a cable 22, and a scope interface (hereinafter, "connector 24"). The probing head 20 may have an integral or replaceable probing tip 26 or other test probe input that is suitable for making an electronic contact with electrical components. The probing head 20 is attached to a first end of the cable 22 and the connector 24 is attached to a second, opposite end of the cable 22.

Test probes are often used to provide an electrical connection between electrical components 28 (e.g. a component lead, wire, circuit board trace, electrical contact, or other component such as those located on a circuit board) and testing instruments 30 (e.g. oscilloscopes, voltmeters, and signal measuring instruments). The electrical connection is made by attaching the connector 24 at the second end of the cable 22 to a testing instrument 30 and using the probing head 20 (and usually an integral or replaceable probing tip 26) at the first end to touch, grip, permanently attach, semi-permanently attach (e.g. soldering), plug into, or otherwise make contact with an electrical component 28. It should be noted that the connector 24 may be integral with the testing instrument 30. As an electrical component 28 is probed with a test probe, the signal flowing through the electrical component 28 registers on the testing instrument 30.

In order to provide correct measurements, testing instruments 30 should be calibrated as accurately as possible. The calibration that is generally used in instruments that measure amplitude improves accuracy by compensating for one or both of the gain and offset errors. Modern testing instruments 30 can calibrate the entire signal path including the testing instrument 30 and the test probe. The process of calibrating the entire signal path can be described in two phases: calibration of the testing instrument 30 and calibration of the test probe. As shown in FIG. 1, calibration of the testing instrument 30 can be done automatically in that it does not require user intervention. Exemplary testing instruments capable of self-calibration include, for example, the LeCroy WavePro series of digital oscilloscopes. As shown in FIG. 2, to calibrate the test probe, the user must remove the probing head 20 from the electrical component 28 (if the probing head 20 is attached to the electrical component 28), attach the probing head 20 to a probe compensation port on the testing instrument 30, and run the calibration routine. When calibration is complete, the user may then reestablish a connection by replacing the probing head 20 on the electrical component 28. Calibration of the test probe, therefore, requires significant user intervention in which the user must perform the manual step of attaching the probing head 20 to a probe compensation port before the actual calibration of the test probe is performed by the testing instrument 30. To find the calibration of the entire signal path, the information from the calibration of the testing instrument 30 is combined with the information from the calibration of the test probe.

Removing and replacing a probing head 20 from an electrical component 28 is problematic because it is often difficult and/or time consuming to accurately place, position, and hold the probing head 20 on the electrical component 28. Further, removing and replacing a probing head 20 from an electrical component 28 may cause damage to the electrical component 28. For example, for sensitive components where the contact area is a soft metal, each time a connection is made the metal may be braded or scraped off. Future connections, therefore, would not be as accurate because the contact would not be as complete. Removing the probing head 20 from the electrical component 28, therefore, is undesirable.

Calibration may be done each time a test probe is connected to a testing instrument 30, each time a testing instrument 30 is turned on, at regularly timed intervals, when the instrument configuration changes, upon a change in temperature, and/or at the user's request.

As mentioned, calibration may be done each time a test probe is connected to a testing instrument 30. To replace a test probe, a user disconnects the current test probe from the testing instrument 30. Then the user connects a new test probe to a testing instrument 30. Test probes are generally replaced when the user needs a new test probe with characteristics that are appropriate for a particular use. The user may also replace a test probe if the current test probe is malfunctioning. Changing a test probe may change parameters such as attenuation, capacitance, frequency response, component tolerances, manufacturing variations, and other calibration variables. Calibrating particular combinations of the testing instrument 30, the testing instrument channel, and the test probe helps to obtain and maintain high measurement accuracy. If in the process of connecting the test probe to the testing instrument 30 and/or the electrical component, the test probe breaks or other calibration variables change, the known testing instruments 30 do not have any provision to deal with this.

Calibration may also be performed each time a testing instrument 30 is activated (e.g. turned on). Testing instruments 30 are generally turned off when they are not in use and must be turned on again when they are to be used. This may happen several times a day and each time the user must remove the probing head 20 from the electrical component 28 and then replace the probing head 20 back on the electrical component 28 when the calibration is complete.

Calibration that is performed at regularly timed intervals (e.g. every two hours), when the frame configuration changes, and/or upon a change in temperature (e.g. when the ambient temperature changes more than 10 degrees C. from the temperature at the time of the last full calibration), may also occur several times a day. At each instance of calibration, the user must remove the probing head 20 from the electrical component 28 and then replace the probing head 20 back on the electrical component 28 when the calibration is complete.

To optimize the accuracy of a particular measurement, a user may also request calibration. A user requested calibration again requiring the user to remove the probing head 20 from the electrical component 28 and then replace the probing head 20 back on the electrical component 28 when the calibration is complete.

If calibration is performed several times a day, the added time and trouble of removing the probing head 20 from the electrical component 28 and then replacing the probing head 20 back on the electrical component 28 may cause significant problems including added time, possible misconnections, poor connections with the contact, and other undesirable consequences of removal and replacement.

BRIEF SUMMARY OF THE INVENTION

Prior art methods required removal of the probing head from the electrical component and then replacement of the probing head back on the electrical component. The increased need for calibration of the test probe makes the time, trouble, and problems of probing head removal and replacement more relevant.

The present invention is directed to a self-calibrating test probe system that does not require probing head removal and replacement. Using the system of the present invention, the test probe may be calibrated or may self-calibrate while the probing head remains connected to an electrical component under test. Further, in one preferred embodiment of the system of the present invention, the entire system (including the test probe and a testing instrument) may be calibrated or may self-calibrate while the probing head remains connected to an electrical component under test.

The self-calibrating electrical testing probe system of the present invention preferably includes a test probe and calibration circuitry. The calibration circuitry preferably includes at least one input resistor, at least one relay, and at least one known calibration reference signal. If the test probe is an active test probe, the calibration circuitry may also include at least one amplifier. Each relay has a first position that provides signal access to a testing signal from an electrical component under test and a second position that provides signal access to the known calibration reference signal. Using the present invention, the error of the test probe and/or system is determined and compensated. Exemplary methods by which the error compensator may provide error compensation includes, for example, amplifying the testing signal, creating a correction table of correction values and adding an appropriate value from the correction table, or mathematically compensating.

The foregoing and other objectives, features, and advantages of the invention will be more readily understood upon consideration of the following detailed description of the invention, taken in conjunction with the accompanying drawings.

DETAILED DESCRIPTION OF THE INVENTION

The present invention is directed to a self-calibrating test probe system. Using the system of the present invention, the test probe 18 may be calibrated or may self-calibrate while the probing head 20 remains connected to an electrical component (or circuit) 28 under test. Further, in one preferred embodiment of the system of the present invention, the entire system (including the test probe 18 and a testing instrument 30) may be calibrated or may self-calibrate while the probing head 20 remains connected to an electrical component 28 under test. Because the test probe 18 may remain connected during this process, the necessity of having to remove the probing head 20 from the electrical component 28 and then replace the probing head 20 on the electrical component 28 is eliminated. Eliminating the need to remove and replace the probing head 20 eliminates significant problems including added time, possible misconnections, poor connections with the contact, and other undesirable consequences of removal and replacement.

Figure 1:
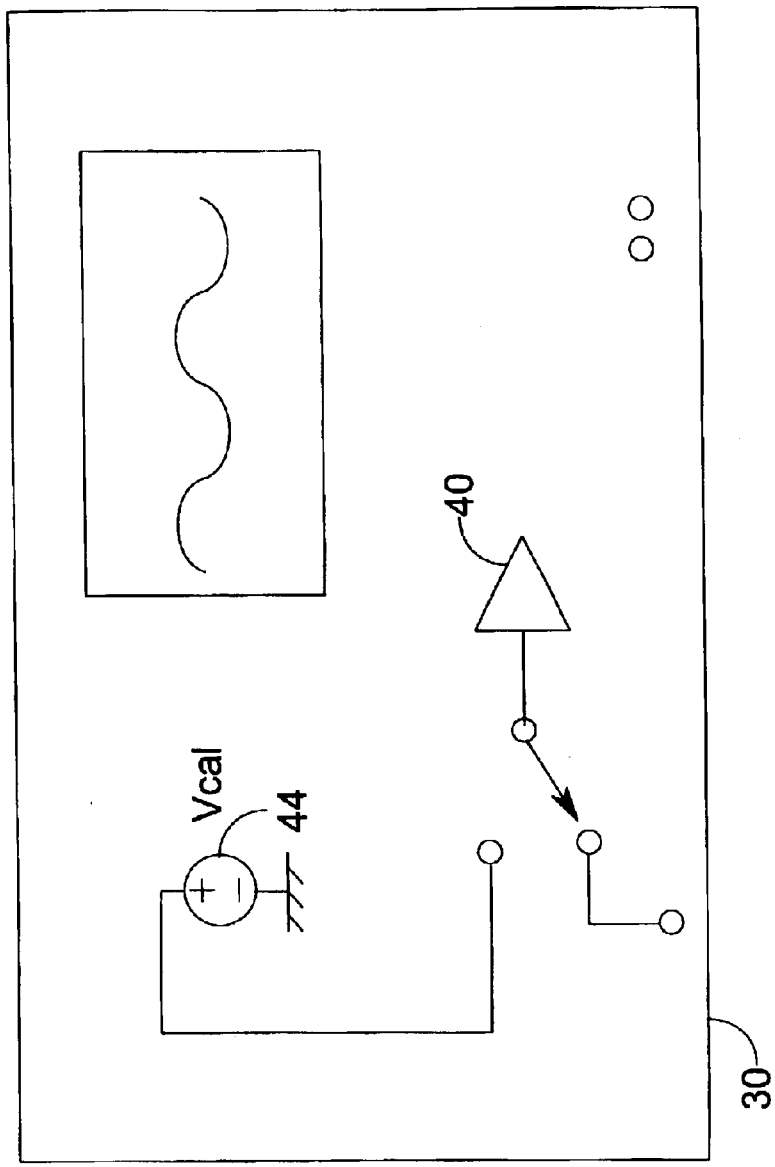
FIG. 1 is a schematic arrangement of a prior art testing instrument capable of self-calibration of the testing instrument.
Figure 2:
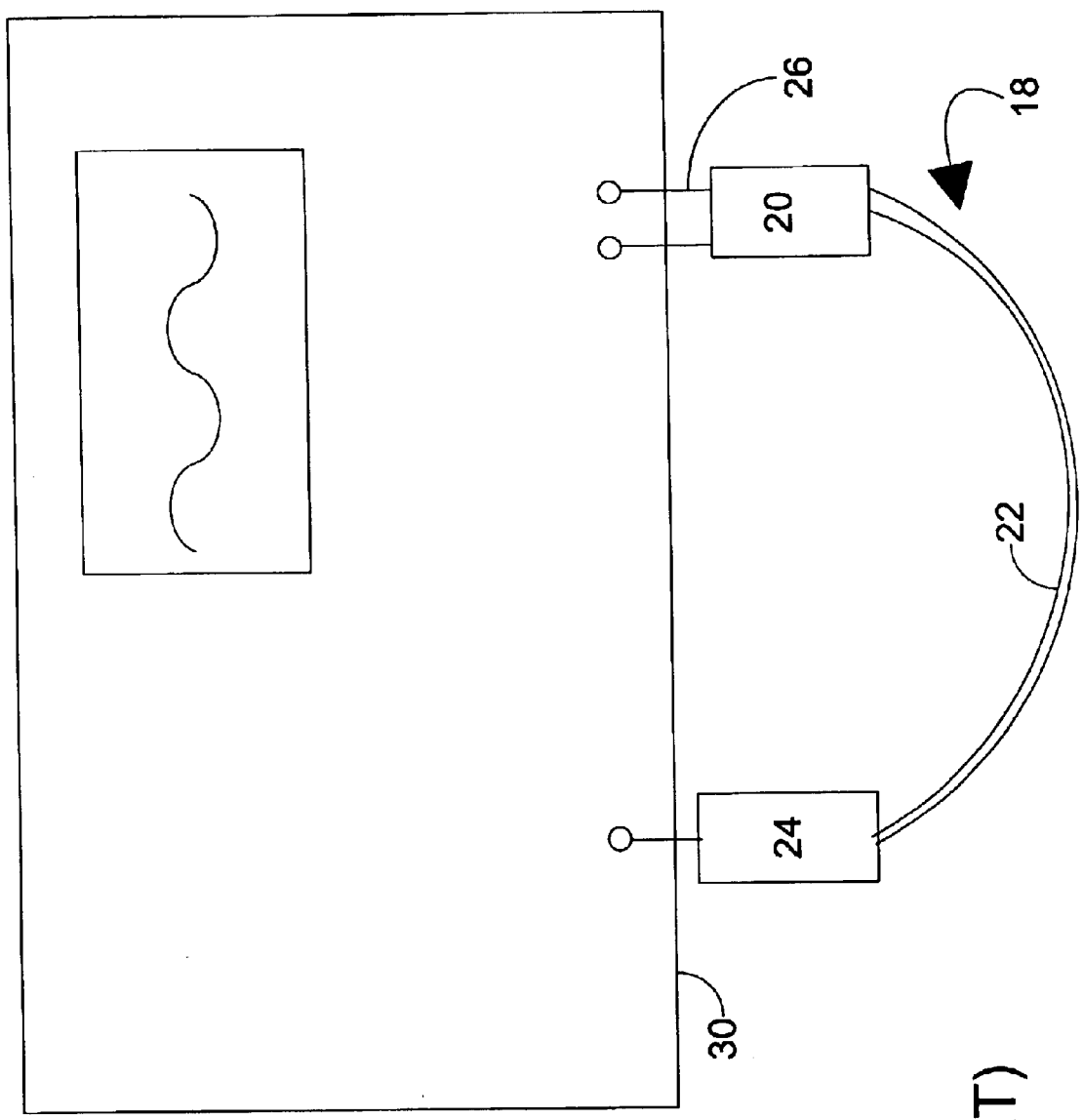
FIG. 2 is a schematic arrangement of a prior art testing instrument capable of calibration of a test probe, but requiring the step of manual attachment of the probing head of a test probe to a probe compensation port on a testing instrument.
Figure 3:
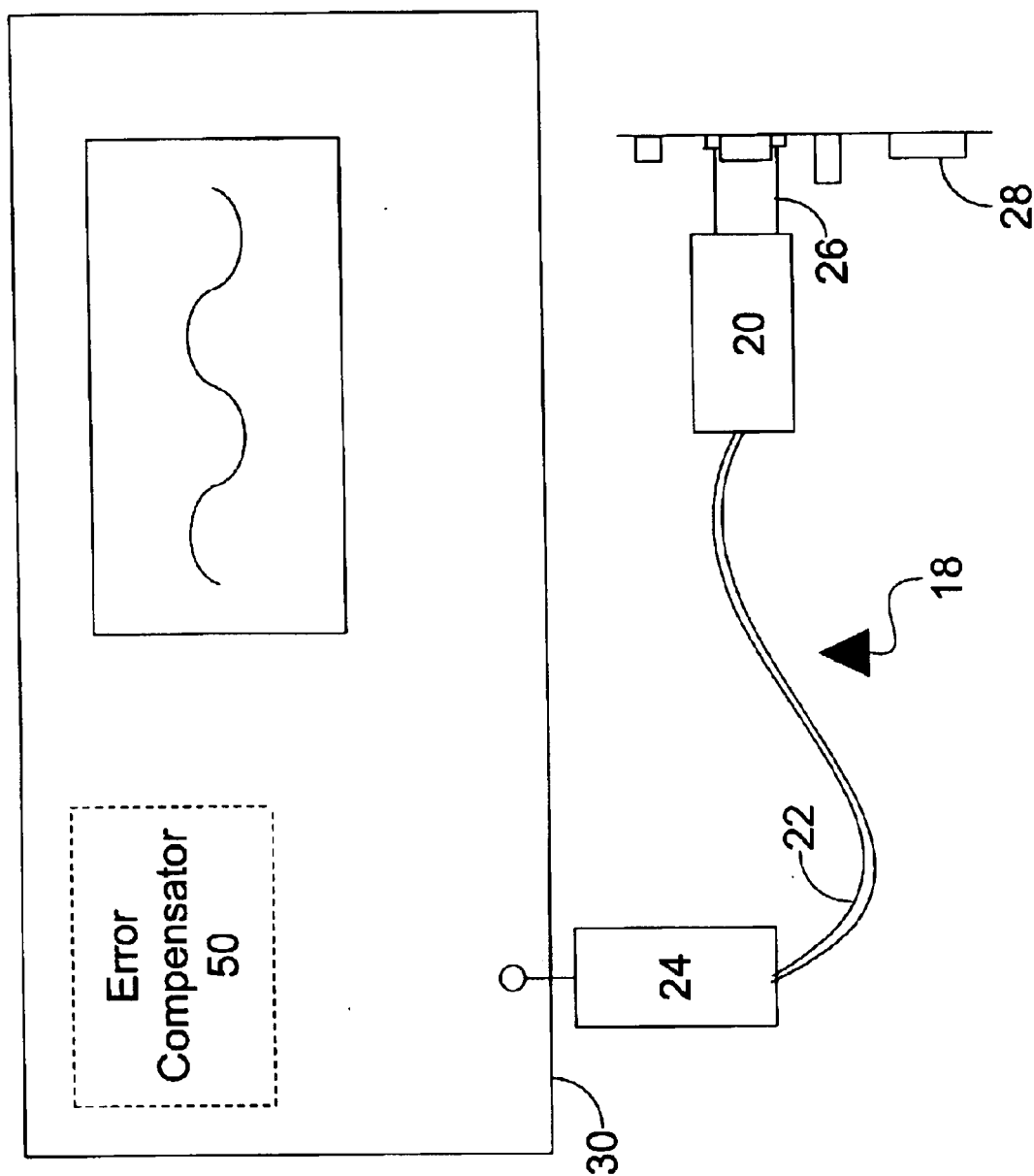
FIG. 3 is a schematic arrangement of an exemplary self-calibration system of the present invention in which the probing head of a test probe may remain connected to electrical components during the calibration process.

As shown in FIG. 3, the present invention includes a test probe 18 having a probing head 20, a cable 22, and a connector 24. The test probe 18 may be, for example, a voltage probe, an active or passive probe, a single ended or differential probe, a resistive divider probe (or low capacitance or $Z_0$ probe), or other known probe. The probing head 20 may have an integral or replaceable probing tip 26 that is suitable for making an electronic contact with electrical components 28. The probing head 20 is attached to a first end of the cable 22 and the connector 24 is attached to a second, opposite end of the cable 22.

FIG. 3 also shows a testing instrument 30 of the present invention that may be, for example, an oscilloscope, a voltmeter, or another signal measuring instrument. The test probe 18 may be used to provide an electrical connection between electrical components 28 and the testing instrument 30. If a particular testing instrument 30 has more than one channel, the present invention may be implemented for each channel. It should be noted that the connector 24 of the test probe 18 may be integral with the testing instrument 30.

As shown in FIG. 3, the probing head 20 (including an integral and/or replaceable probing tip 26) is connected to the electrical component 28. During the calibration process of the present invention, there is no need to remove and/or reattach the probing head 20. It should be noted, however, that calibration could be done using the present invention even if the probing head 20 was not attached to an electrical component 28. For example, the probing head 20 could be laying on a table or being held by the user. Further, the testing instrument 30 could be calibrated (but not the test probe 18) if the test probe 18 was not attached to the testing instrument 30. Still further, if a test probe that did not include the circuitry of the present invention was attached to the testing instrument 30, the testing instrument 30 could still be calibrated (but not the test probe).

The present invention is accomplished by the realization of the advantages of not having to remove the probing head 20 from the electrical component 28 and then replace the probing head 20 on the electrical component 28 after calibration. Recent technologies such as the MicroElectroMechanical (MEM) relay, and other micro-miniaturized technologies allow the geometry of components to be shrunk. This reduces the parasitic capacitance and inductance so that they are minimal. Certain embodiments that might have been cumbersome using older technologies are now very manageable. It should be noted, however, that the present invention could be implemented using traditional or older technology components. For example, an electromechanical relay may be replaced with a switching element or electronic equivalents such as FETs or PIN diodes.

The present invention preferably includes components such as at least one input resistor 38, at least one amplifier 40, at least one relay 42, and a known calibration reference voltage ($V_{CAL}$) 44. As will be discussed below, depending on the embodiment, some of the components may be omitted (e.g. an amplifier is not needed in a passive probe) and the placement of the components may be varied.

Figure 8:
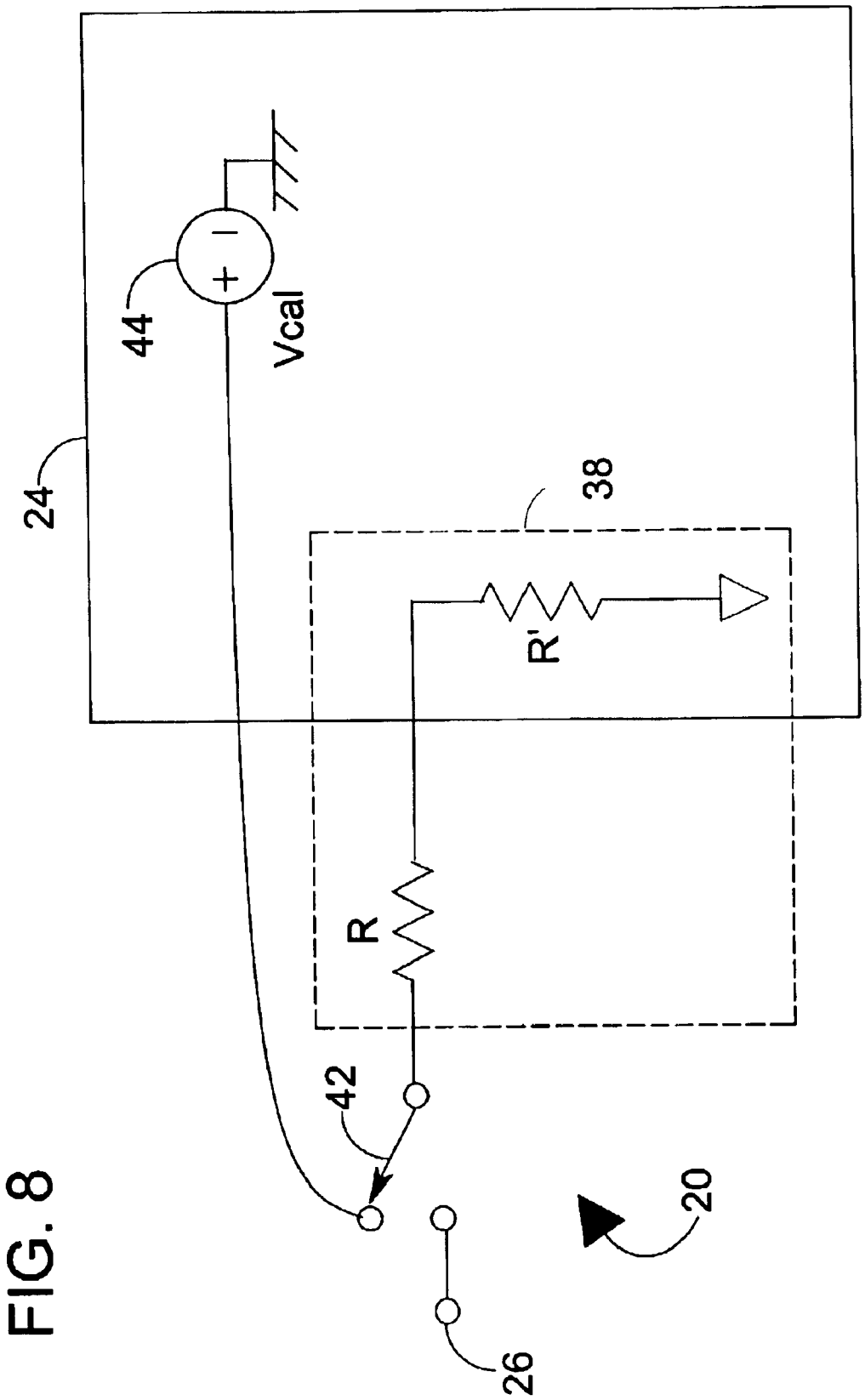
FIG. 8 is a circuit diagram of an exemplary self-calibrating passive single-ended probing head of the present invention in which upper resistor R of the input attenuating network is built into the probing head and lower resistor R' of the input attenuating network is built into the connector.
Figure 9:
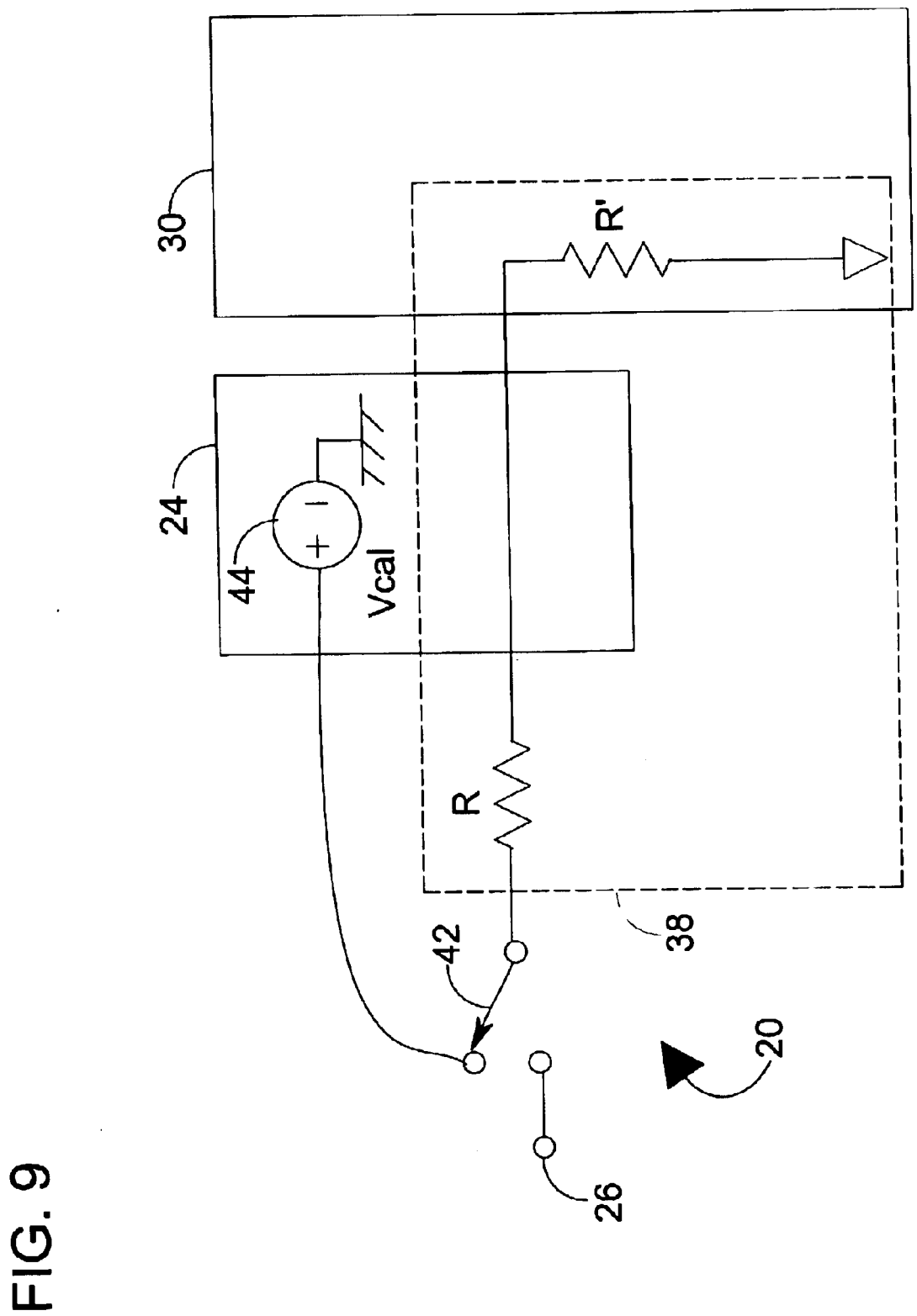
FIG. 9 is a circuit diagram of an exemplary self-calibrating passive single-ended probing head of the present invention in which upper resistor R of the input attenuating network is built into the probing head and lower resistor R' of the input attenuating network is built into the testing instrument.
Figure 10:
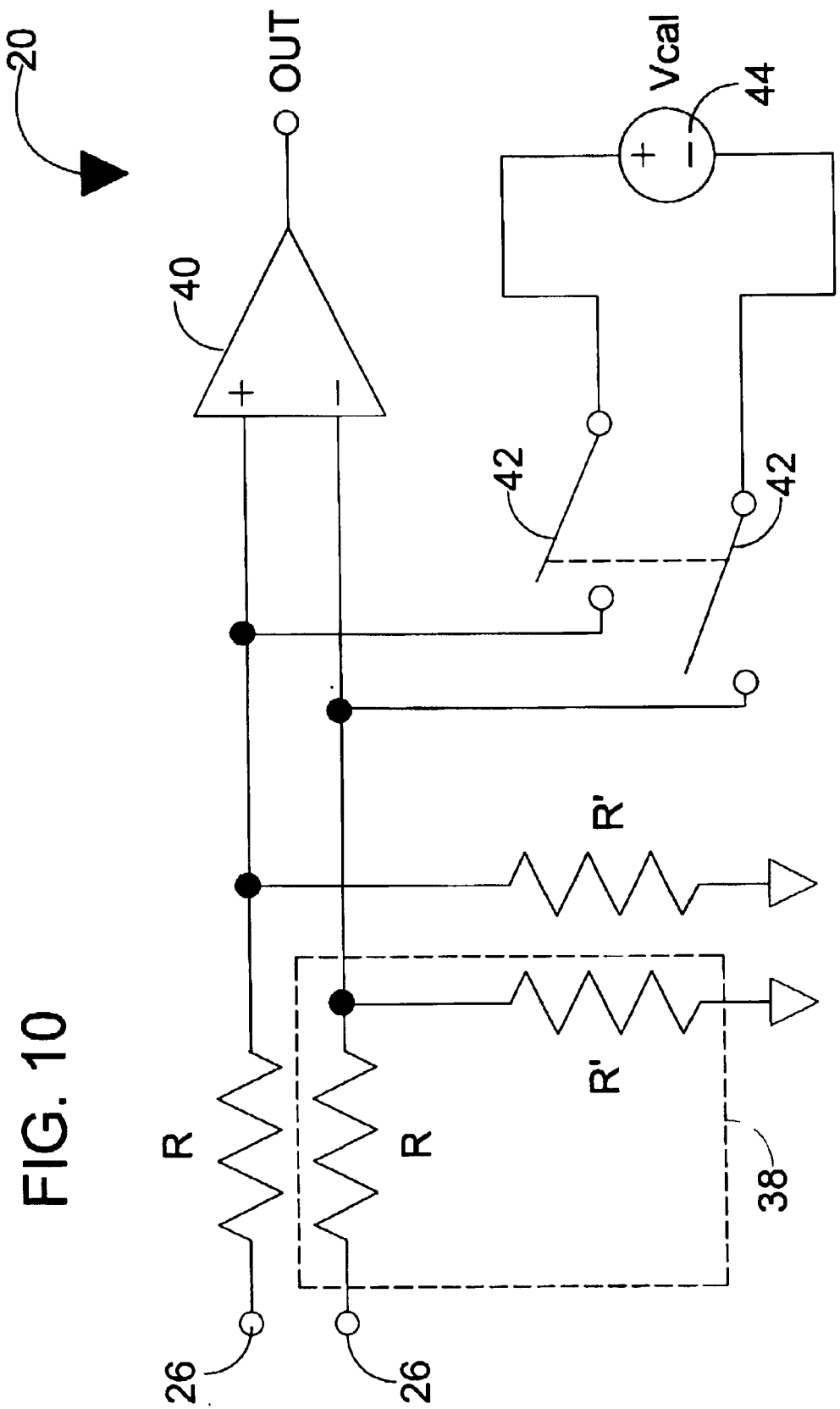
FIG. 10 is a circuit diagram of an exemplary self-calibrating differential probing head of the present invention in which the calibration reference voltage is applied at the output of the attenuating resistor.
Figure 11:
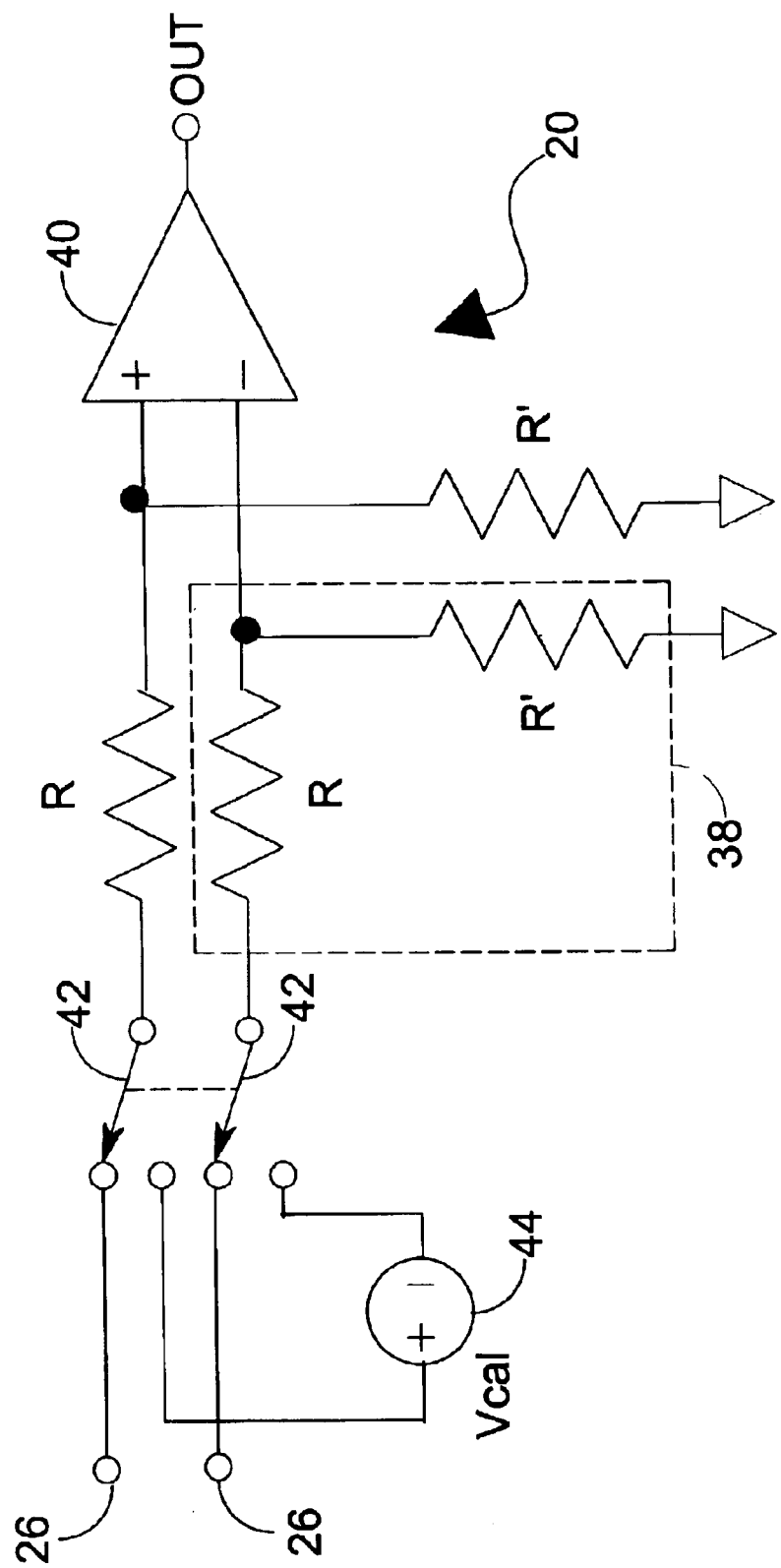
FIG. 11 is a circuit diagram of an exemplary self-calibrating differential probing head of the present invention in which the calibration reference voltage is in the probing head, the external relay being at the input.
Figure 12:
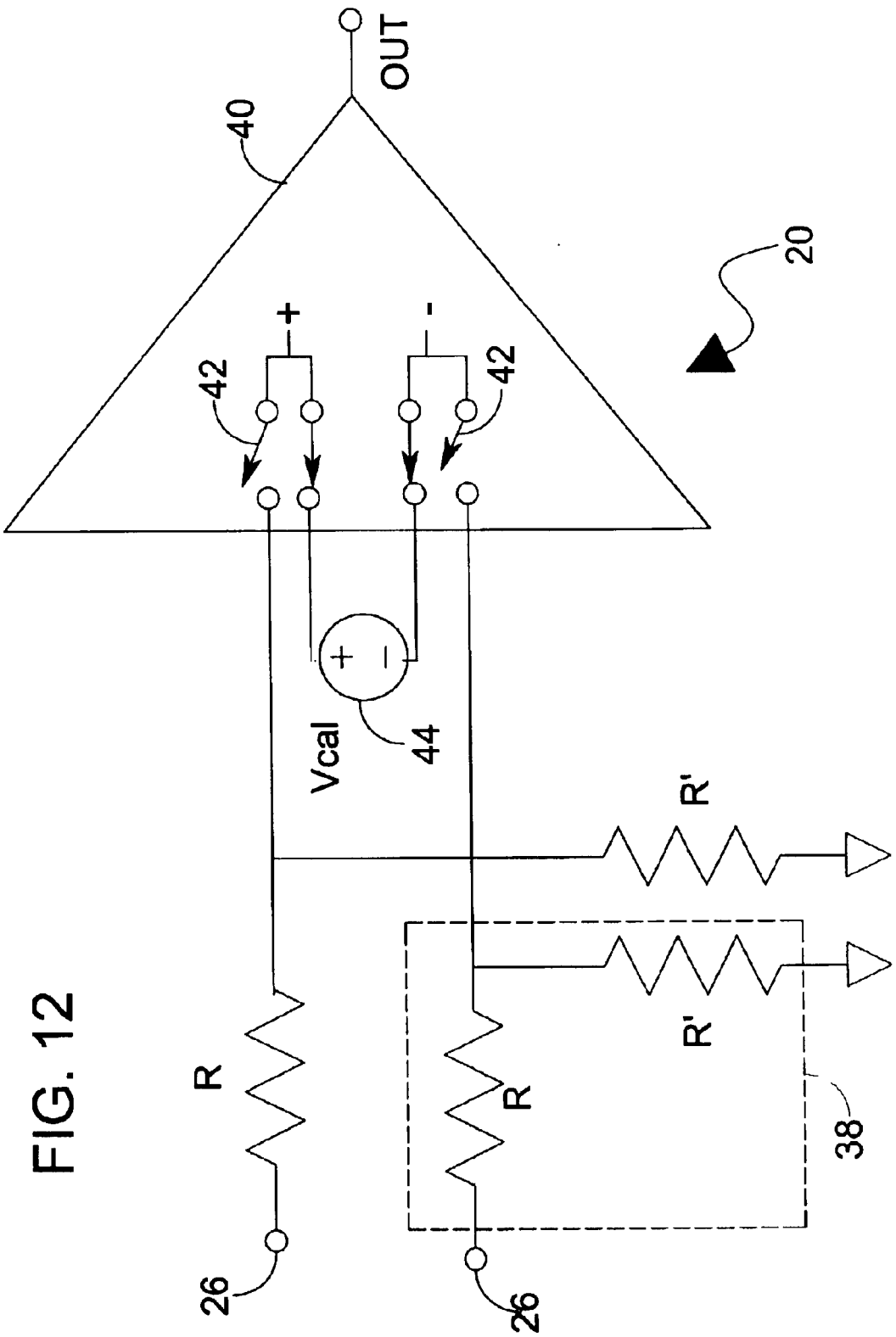
FIG. 12 is a circuit diagram of an exemplary self-calibrating differential probing head of the present invention incorporating a MEMs relay and in which the calibration reference voltage is in the probing head.

Turing first to the input resistor 38, for exemplary purposes, the present invention is shown with an input attenuating network 38 at the front of the probing head 20. FIGS. 4–7 show a single-ended probing head 20 with a divider resistor as the input resistor 38. FIG. 8 shows an alternative embodiment in which the lower resistor R' is built into the connector 24. FIG. 9 shows another alternative embodiment in which the lower resistor R' is built into the testing instrument 30. FIGS. 10–12 show exemplary differential probing heads 20 with two sets of input resistors 38 (one input resistor set is in the phantom box 38 and the other input resistor set is comprised of the remaining resistors R and R'). The input attenuating network 38 may have a variable resistance.

The test probe amplifier 40 may be, for example, either discrete or integrated into a monolithic integrated circuit. As shown in the embodiment of FIG. 12, the amplifier 40 may be configured to include one or more additional relay 42. An amplifier 40 may be eliminated in a passive probe embodiment such as those shown in FIGS. 8 and 9. Further, there may be more than one amplifier. Still further, the amplifier may be discrete or integrated.

A relay 42 may be used to connect the calibration reference voltage 44 to the test probe input 26. Each relay 42 has a first position and a second position. The first position providing signal access to the testing signal from an electrical component 28 under test. The second position providing signal access to the known calibration reference signal 44. In a differential probing head 20 having two test probe input(s) 26, each test probe input may have an associated relay 42 to connect it to the calibration reference voltage 44. Relay 42 may be, for example, an electromechanical relay, a switching element, or an electronic equivalent of a relay (e.g. FETs or PIN diodes). Further, depending on the bandwidth of the probes, either electromechanical relays or solid-state relays (e.g. FETs). If, for example, the amplifier is a monolithic integrated circuit, the relays may be MOSFETS or JFETS integrated on the die. The selection of switch technology may be determined, therefore, by the performance needs of the amplifier.

Figure 4:
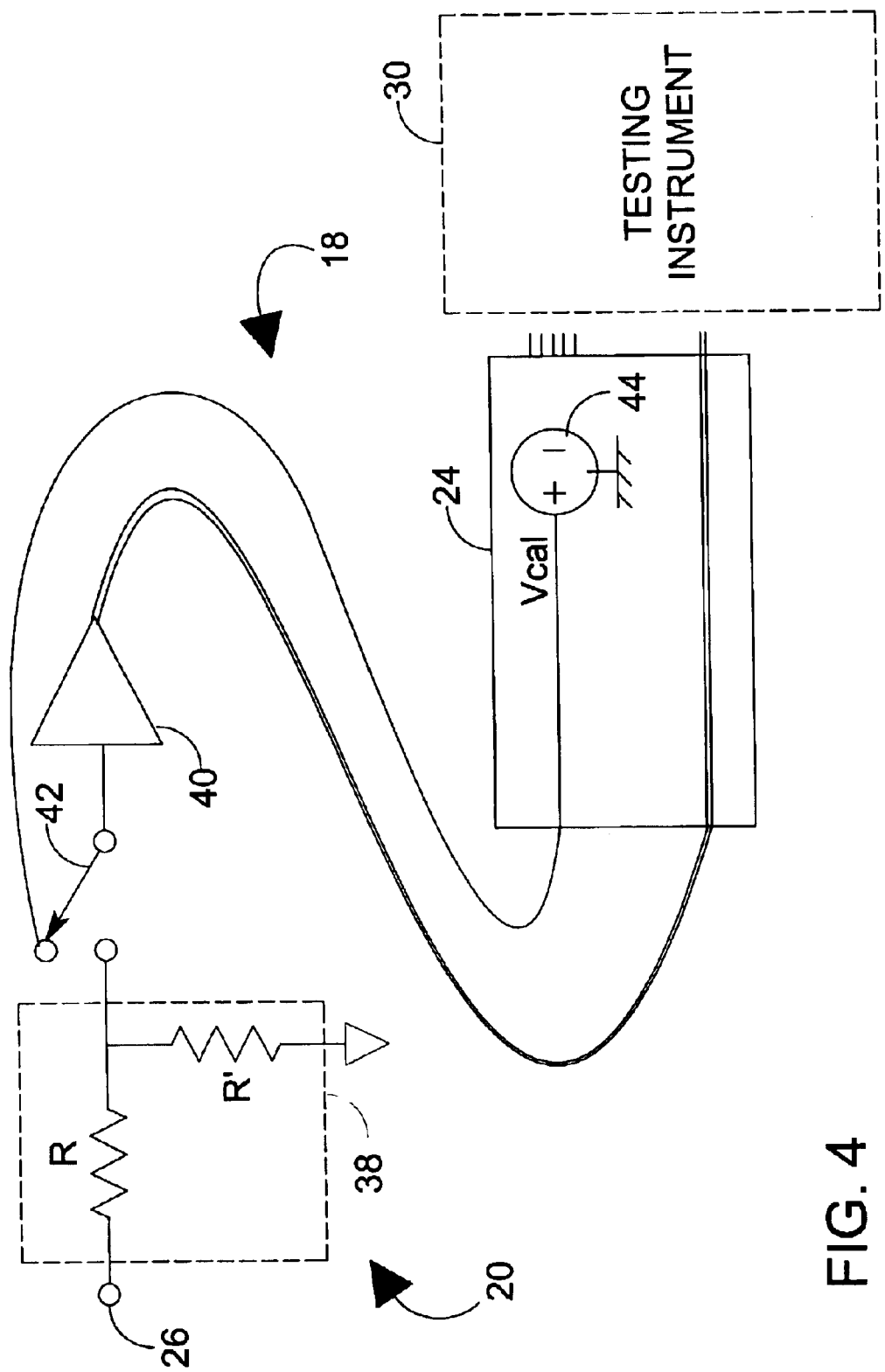
FIG. 4 is a schematic arrangement of an exemplary self-calibration system of the present invention in which the probing head is a single-ended probing head and the calibration reference voltage is in the connector.
Figure 5:
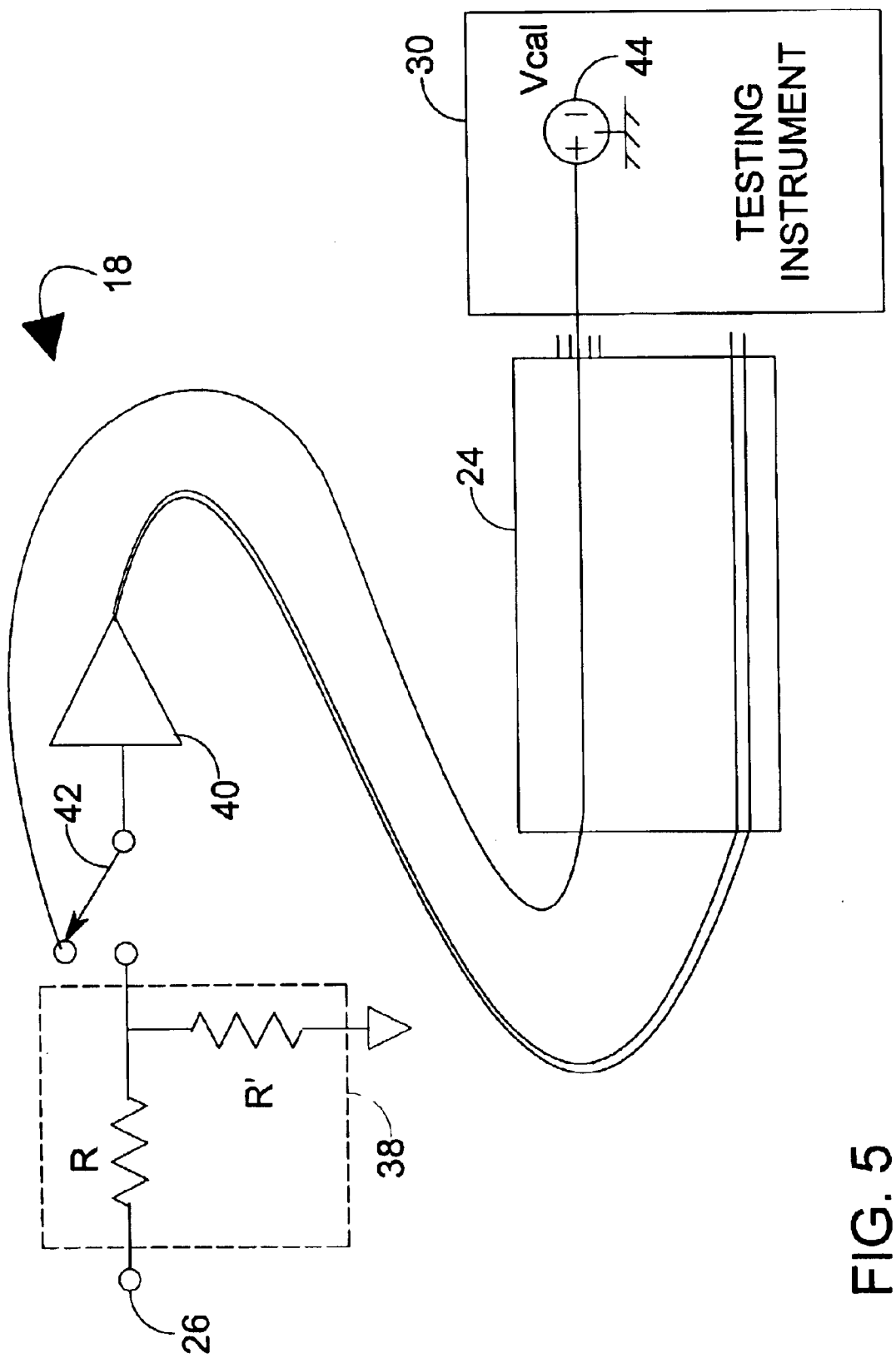
FIG. 5 is a schematic arrangement of an exemplary self-calibration system of the present invention in which the probing head is a single-ended probing head and the calibration reference voltage is in the testing instrument.

The calibration reference voltage 44 may be positioned in the probing head 20 (FIGS. 6–7), in the connector 24 (FIGS. 4 and 8), or in the testing instrument 30 (FIGS. 5 and 9). The calibration reference voltage 44 can be generated in a digital to analog converter (DAC), or by other means. The advantage to having the calibration reference voltage 44 positioned in the probing head 20 or in the connector 24 is that the probe will work on any testing instrument 30 (i.e. testing instrument independent) and that the calibration reference voltage 44 could be easily replaced if it is damaged or inaccurate. An advantage to having the calibration reference voltage 44 positioned in the testing instrument 30 is that the testing instrument 30 can control the calibration reference voltage 44 with the internal calibration of the testing instrument 30. In some situations, being able to control the calibration reference voltage 44 with the internal calibration of the testing instrument 30 may give greater system accuracy. Although the term calibration reference voltage is used throughout this specification, for an alternative type of probe the appropriate calibration reference signal would be applied. Although the term "calibration reference voltage" is used in its singular form throughout this specification, it should be noted that the calibration reference signal might be a variable signal that may be set, for example to 0 volts, which is necessary for offset calibration.

FIG. 3 also shows an error compensator 50 that may be implemented as hardware, software, or a combination of hardware and software. The error compensator 50 may be implemented as part of a microcomputer that controls the testing instrument 30. The error compensator 50 may perform multiple functions (e.g. steps of methods as discussed below) and may have separate components for each function. For example, if the error compensator 50 controls the operation of the relay 42, a separate relay control module may control the actual operation. Exemplary methods by which the error compensator 50 may provide error compensation includes, for example, amplifying the testing signal with a variable gain amplifier, creating a correction table of correction values and adding an appropriate value from the correction table, or mathematically compensating. Although shown in the testing instrument 30, the error compensator 50 may also be positioned in the test probe 18, in an external module, or spread between more than one of the various possible positions.

To calibrate the system, the relay 42 toggles to disconnect the input from the user's testing signal and connect the input to a known calibration reference voltage 44. If the signal path between the test probe input and the amplifier circuit is an input attenuating network, it is not necessary to break the input connection during the calibration cycle.

Description of Exemplary Embodiments

The following paragraphs detail the exemplary embodiments shown in FIGS. 4–12. It should be noted that these embodiments are meant to be exemplary and alternate embodiments are possible as discussed throughout this specification. For example, combining features shown in the drawings, even if the specific combination is not shown, would be included in the present invention.

FIGS. 4 and 5 are schematic arrangements of an exemplary self-calibration system in which the probing head 20 is a single-ended probing head and the calibration reference voltage 44 is in the test probe 18 (FIG. 4 shows it in the connector 24) and the testing instrument 30 (FIG. 5). In this embodiment, the relay 42 is positioned behind the input resistor 38 and in front of the amplifier 40. Positioning the relay 42 behind the input resistor 38 creates a probing head 20 embodiment that works well at high frequencies and does not have the problems with parasitic capacitance and inductance of the relay contacts that may be present in other embodiments. Because the relay 42 is positioned behind the input resistor 38, the input resistor 38 is not truly calibrated. Often the errors in the input resistor 38 are minimal and no compensation is necessary. One method, however, for dealing with or compensating for the errors in the input resistor 38 would be to measure the gain and offset errors for the input resistor 38 at the factory so that the measured error may be incorporated in the calibration routine. As the errors in the input resistor 38 tend to be relatively constant, this is a reasonable means for compensating for these errors. Another method, however, for dealing with or compensating for the errors in the input resistor 38 would be to make the errors minimal by using an input resistor 38 that has been laser trimmed. It should be noted that the calibration reference voltage 44 may be positioned elsewhere, such as in the probing head 20. Using the schematic arrangement shown in this figure, the entire system, including the test probe 18 and the testing instrument 30, may be calibrated or may self-calibrate while the probing head 20 remains connected to an electrical component 28, as it is not necessary to break the input connection during the calibration cycle.

Figure 6:
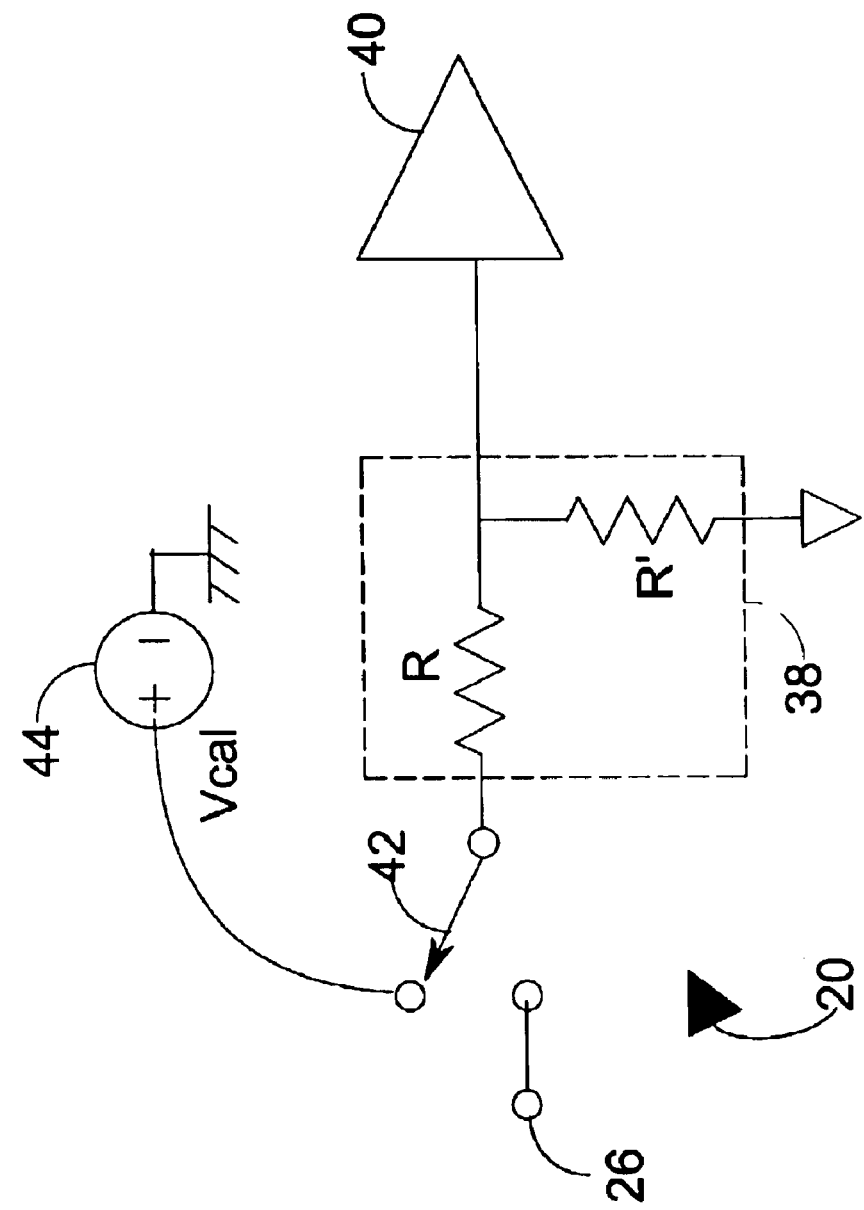
FIG. 6 is a circuit diagram of an exemplary probing head of the present invention in a self-calibrating active single-ended probing head in which the relay is positioned in front of the input attenuating network.

FIG. 6 is a circuit diagram of an exemplary self-calibrating active single-ended probing head 20 in which the relay 42 is positioned in front of the input attenuating network 38. This configuration is the ideal position for relay 42 because the entire test probe 18, including the input resistor 30 is truly calibrated. Based on current technologies, this configuration would most likely be more useful in a slower, lower frequency test probe 18 where parasitic capacitance and inductance of the relay contacts are not a significant issue. If the present invention is implemented for lower frequency test probes 18, the invention may be implemented using solid state (FET) relays 42. Using current technology, for a faster, higher frequency test probe 18 the relay 42 is preferably positioned on the IC as is shown in FIGS. 4 and 5. The inventor of the present invention recognizes the advantages to this configuration and, if technology advances, would attempt to implement this configuration for a faster test probe 18. Accordingly, it is within the scope of the present invention to position the relay 42 in front of the input resistor 38 for faster, higher frequency test probes 18. It should be noted that the calibration reference voltage 44 might be positioned, for example, anywhere in the test probe 18 or in the testing instrument 30. Using the schematic arrangement shown in this figure, the entire system, including the test probe 18 and the testing instrument 30, may be calibrated or may self-calibrate while the probing head 20 remains connected to an electrical component 28, as it is not necessary to break the input connection during the calibration cycle.

Figure 7:
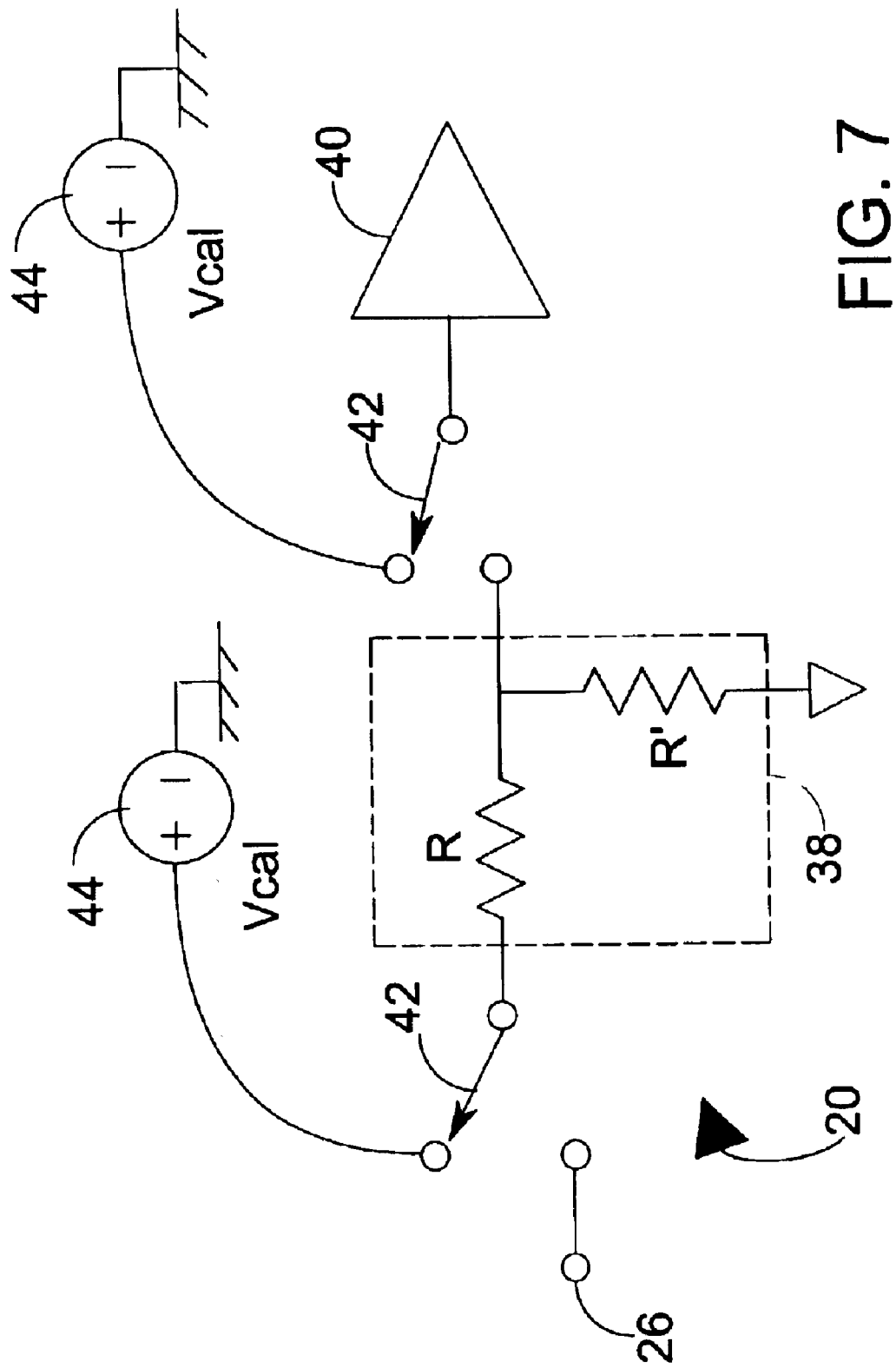
FIG. 7 is a circuit diagram of an exemplary probing head of the present invention in a self-calibrating active single-ended probing head in which a first relay is positioned in front of the input attenuating network and a second relay is positioned behind the input attenuating network.

FIG. 7 is a circuit diagram of an exemplary self-calibrating active single-ended probing head 20 in which a first relay 42 is positioned in front of the input attenuating network 38 and a second relay 42 is positioned in behind the input attenuating network 38 and in front of the amplifier 40. This configuration may be implemented so that the first relay 42 is used when measuring a slower, lower frequency test probe 18 and the second relay 42 is used when measuring a faster, higher frequency test probe 18. The inventor of the present invention recognizes the advantages to this configuration and, if technology advances, would attempt to implement this configuration for a mixed-use test probe 18. Accordingly, it is within the scope of the present invention to position a first relay 42 in front of the input attenuating network 38 and a second relay 42 behind the input attenuating network 38 and in front of the amplifier 40. It should be noted that the calibration reference voltage 44 might be positioned, for example, in the test probe 18 or in the testing instrument 30. It should also be noted, that although it is not shown, this configuration may be implemented in alternative embodiments (e.g. in a differential probe). Using the schematic arrangement shown in this figure, the entire system, including the test probe 18 and the testing instrument 30, may be calibrated or may self-calibrate while the probing head 20 remains connected to an electrical component 28, as it is not necessary to break the input connection during the calibration cycle.

FIGS. 8 and 9 show exemplary implementations of the present invention as passive probes. Passive probes are often desirable because they provide an inexpensive alternative device to acquire signals that is convenient, rugged, and accurate over a wide dynamic range. FIG. 8 is a circuit diagram of an exemplary self-calibrating passive single-ended probing head 20 in which upper resistor R of the input attenuating network is built into the probing head and lower resistor R' of the input attenuating network is built into the connector. FIG. 9 is a circuit diagram of an exemplary self-calibrating passive single-ended probing head of the present invention in which upper resistor R of the input attenuating network is built into the probing head and lower resistor R' of the input attenuating network is built into the testing instrument. In comparison to FIGS. 8 and 9, the other embodiments (e.g. those shown in FIGS. 4–7 and 10–12) are shown with the input attenuating network 38 built into the probing head 20. It should be noted that the calibration reference voltage 44 might be positioned, for example, in the test probe 18 or in the testing instrument 30. It should also be noted, that although it is not shown, the passive mode embodiment may be implemented in alternative embodiments (e.g. in a differential probe). Using the schematic arrangement shown in this figure, the entire system, including the test probe 18 and the testing instrument 30, may be calibrated or may self-calibrate while the probing head 20 remains connected to an electrical component 28, as it is not necessary to break the input connection during the calibration cycle.

FIG. 10 is a circuit diagram of an exemplary self-calibrating differential probing head 20 in which the calibration reference voltage 44 is in the probing head 20. It should be noted that only one input resistor (R and R') is shown in phantom box 38, but the second input resistor 38 includes the remaining resistors R and R'. To maintain good common mode rejection, in the preferred embodiment, the connections to both relays should be identical in geometries, balancing the parasitic capacitance and inductance. Similar to the embodiments shown in FIGS. 4 and 5, in this embodiment the relays 42 are functionally positioned behind the input resistors 38 and in front of the amplifier 40. As mentioned above, positioning the relays 42 behind the input resistors 38 creates a probing head 20 embodiment that works well at high frequencies. As was also discussed, because the relays 42 are positioned behind the input resistors 38, the input resistors 38 are not truly calibrated. The errors in the input resistor 38 may be dealt with as discussed above for the embodiments of FIGS. 4 and 5. It should be noted that under certain circumstances, when using this embodiment a voltage signal may come out of the test probe inputs 26 during the calibration cycle. Accordingly, use of this embodiment should be limited to circuits which would not be adversely effected by the voltage signal. On the other hand, if the signal path between the test probe inputs 26 and the amplifier circuit 40 is an input attenuating network 38, it is not necessary to break the input connection during the calibration cycle. It should also be noted that the calibration reference voltage 44 may be positioned elsewhere, such as in the connector 24 or in the testing instrument 30. Using the schematic arrangement shown in this figure, the entire system, including the test probe 18 and the testing instrument 30, may be calibrated or may self-calibrate while the probing head 20 remains connected to an electrical component 28 as it is not necessary to break the input connection during the calibration cycle.

FIG. 11 is a circuit diagram of an exemplary self-calibrating differential probing head 20 in which the calibration reference voltage 44 is in the probing head 20, the external relay being at the input. It should be noted that only one input resistor (R and R') is shown in phantom box 38, but the second input resistor 38 includes the remaining resistors R and R'. To maintain good common mode rejection, in the preferred embodiment, the connections to both relays should be identical in geometries, balancing the parasitic capacitance and inductance. Similar to the embodiment shown in FIG. 6, the relays 42 are positioned in front of the input attenuating networks 38. This configuration is the ideal position for relay 42 because the entire test probe 18, including the input resistors 30 are truly calibrated. The same limitations as were discussed for the embodiment of FIG. 6 would be applicable for this embodiment. It should be noted that the calibration reference voltage 44 might be positioned, for example, anywhere in the test probe 18 or in the testing instrument 30. Using the schematic arrangement shown in this figure, the entire system, including the test probe 18 and the testing instrument 30, may be calibrated or may self-calibrate while the probing head 20 remains connected to an electrical component 28, as it is not necessary to break the input connection during the calibration cycle.

FIG. 12 is a circuit diagram of an exemplary self-calibrating differential probing head 20 incorporating MEMs relays and in which the calibration reference voltage 44 is in the probing head 20. Specifically, FIG. 12 shows an amplifier 40 with MEMs relays 42 incorporated on an IC. Using these types of miniaturized components, parasitic elements are substantially insignificant. It should be noted that only one input resistor (R and R') is shown in phantom box 38, but the second input resistor 38 includes the remaining resistors R and R'. To maintain good common mode rejection, in the preferred embodiment, the connections to both relays should be identical in geometries, balancing the parasitic capacitance and inductance. Similar to the embodiments shown in FIGS. 4, 5, and 10, in this embodiment the relays 42 are functionally positioned behind the input resistors 38 and the advantages and disadvantages discussed relating thereto applies for the embodiment shown in this figure. Most of the other embodiments may be implemented by incorporating a MEMs relays 42 as shown in this figure. It should be noted that the calibration reference voltage 44 might be positioned, for example, anywhere in the test probe 18 or in the testing instrument 30. Using the schematic arrangement shown in this figure, the entire system, including the test probe 18 and the testing instrument 30, may be calibrated or may self-calibrate while the probing head 20 remains-connected to an electrical component 28, as it is not necessary to break the input connection during the calibration cycle.

Exemplary Method for Using the Present Invention

As mentioned above, to calibrate the system, the relay 42 toggles to disconnect the input from the user's testing signal and connect the input to a known calibration reference voltage 44. If the signal path between the test probe input and the amplifier circuit is an input attenuating network, it is not necessary to break the input connection during the calibration cycle. The following is an exemplary method for using a test probe 18 incorporating the present invention. The method may be modified based on the embodiment. For example, although the relay 42 and input resistor 38 are used in their singular form, there would be two relays 42 and two input resistors 38 in a differential probe. It should be noted that some or all of the steps may be performed by the error compensator 50.

During the calibration process of the present invention, there is no need to remove and/or reattach the probing head 20 to an electrical component 28. It should be noted, however, that calibration could be done using the present invention even if the probing head 20 was not attached to an electrical component 28. Instead, the test probe 18 at least one relay 42 toggles to disconnect the relay 42 input from a testing signal and connect the relay 42 input to a known calibration reference source 44.

Once the relay 42 has toggled to the known calibration reference source 44, the system applies a known calibration reference signal from the known calibration reference source 44 to the test probe 18. The known calibration reference signal has an associated expected signal.

The system then tests the known calibration reference signal applied to the test probe 18 to obtain a measured signal. The measured signal is then compared with the expected signal to find the difference therebetween. The difference between the measured signal and the expected is the test probe 18 measured error.

Compensation for the test probe 18 measured error may then be provided by known compensation methods. For example, the test probe 18 measured error may be compensated for by amplifying the testing signal, creating a correction table of correction values and adding an appropriate value from the correction table, or mathematically compensating.

In calibrating the entire system, in addition to the test probe 18 measured error, there may be additional errors for which compensation is needed. For example, the input resistor 38 error and the testing instrument 30 error may also require compensation.

Input resistor 38 error may be present in test probes in which the relay 42 is positioned behind the input resistor 38 (e.g. embodiments shown in FIGS. 4, 5, and 10). As the input resistor 38 error is often minimal, no compensation may be necessary. One method, however, for dealing with or compensating for the input resistor 38 error would be to measure the gain and offset errors for the input resistor 38 at the factory so that the input resistor 38 error may be incorporated in the calibration routine. As the input resistor 38 error tends to be relatively constant, this is a reasonable means for compensating for these errors. Another method, however, for dealing with or compensating for the input resistor 38 error would be to make the error minimal by using an input resistor 38 that has been laser trimmed.

It should be noted that the entire system may be measured so as to eliminate the necessity of performing mathematical computations. For example, if the known calibration reference signal were applied such that it flows through both the testing instrument 30 and the test probe 18 the entire system would be measured at the same time and the need for performing mathematical computations would be eliminated.

Testing instrument 30 error is generally the gain and offset errors of the testing instrument 30. Testing instrument 30 error may be measured using known methods.

Once the correction factors (e.g. the test probe 18 measured error, the input resistor 38 error, and the testing instrument 30 error) are determined, they can be used for the full test probe calibration. Specifically, one method for compensating for the correction factors may be to amplify the testing signal to compensate for the correction factors. (For example, correction voltages can be applied as needed to drive the output of the amplifier to the expected voltage.) Another method for compensating for the correction factors may be to create a correction table of correction values and then add an appropriate value from the correction table to compensate for the correction factors. Yet another method for compensating for the correction factors may be to mathematically compensate for the correction factors.

The method of the present invention may be performed as part of a self-calibration routine. The self-calibration routine may be performed in response to conditions such as a test probe being connected to a testing instrument, a test probe being disconnected to a testing instrument, a testing instrument being turned on or off, at regularly timed intervals, when a instrument configuration changes, upon an increase or decrease in temperature, or upon a user's request.

The terms and expressions that have been employed in the foregoing specification are used as terms of description and not of limitation, and are not intended to exclude equivalents of the features shown and described or portions of them. The scope of the invention is defined and limited only by the claims that follow.

What is claimed is:

1. A self-calibrating electrical testing probe system comprising:
   (a) a test probe comprising:
      (i) a cable having a first cable end and a second cable end;
      (ii) a probing head associatable with said first cable end; and
      (iii) a connector associatable with said second cable end; and
   (b) calibration circuitry at least partially located in said test probe, said calibration circuitry comprising:
      (i) at least one input resistor;
      (ii) at least one amplifier;
      (iii) at least one relay; and
      (iv) at least one known calibration reference voltage;
   (c) wherein said test probe may be calibrated while it remains connected to an electrical component under test.

2. The system of claim 1 further comprising a testing instrument.

3. The system of claim 2 wherein said testing instrument is an oscilloscope.

4. The system of claim 2 wherein said connector is integral with said testing instrument.

5. The system of claim 1 wherein said at least one relay is functionally positioned behind said at least one input resistor.

6. The system of claim 1 wherein said at least one relay is functionally positioned in front of said at least one input resistor.

7. The system of claim 1 wherein said calibration reference voltage may be positioned in a location selected from the group consisting of:
   (a) said probing head;
   (b) said connector; and
   (c) said testing instrument.

8. The system of claim 1 wherein said electrical testing probe system may self-calibrate said test probe.

9. The system of claim 1 wherein said electrical testing probe system may self-calibrate said test probe in response to at least one condition selected from the group consisting of:
   (a) a test probe being connected to a testing instrument;
   (b) a test probe being disconnected to a testing instrument;
   (c) a testing instrument being turned on;
   (d) a testing instrument being turned off;
   (e) at regularly timed intervals;
   (f) when a instrument configuration changes;
   (g) upon an increase in temperature;
   (h) upon a decrease in temperature; and
   (i) upon a user's request.

10. A self-calibrating test probe system comprising:
    (a) a testing instrument;
    (b) a test probe having a probing head at a first end and a connector at a second end, said connector associatable with said testing instrument; and
    (c) calibration circuitry at least partially located in said test probe, said calibration circuitry comprising:
       (i) at least one input resistor;
       (ii) at least one amplifier;
       (iii) at least one relay; and
       (iv) at least one known calibration reference voltage;
    (d) wherein said test probe system self-calibrates while it remains connected to an electrical component under test.

11. The system of claim 10 wherein said testing instrument is an oscilloscope.

12. The system of claim 10 wherein said connector is integral with said testing instrument.

13. The system of claim 10 wherein said at least one relay is functionally positioned behind said at least one input resistor.

14. The system of claim 10 wherein said at least one relay is functionally positioned in front of said at least one input resistor.

15. The system of claim 10 wherein said calibration reference voltage may be positioned in a location selected from the group consisting of:
    (a) said probing head;
    (b) said connector; and
    (c) said testing instrument.

16. The system of claim 10 wherein said electrical testing probe system may be calibrated while said test probe remains connected to said electrical component under test.

17. The system of claim 10 wherein said electrical testing probe system may self-calibrate in response to at least one condition selected from the group consisting of:
    (a) a test probe being connected to a testing instrument;
    (b) a test probe being disconnected to a testing instrument;
    (c) a testing instrument being turned on;
    (d) a testing instrument being turned off;
    (e) at regularly timed intervals;
    (f) when a instrument configuration changes;
    (g) upon an increase in temperature;
    (h) upon a decrease in temperature; and
    (i) upon a user's request.

18. A method for self-calibrating an electrical testing probe, said method comprising:
    (a) providing a testing instrument;
    (b) providing a test probe having at least one relay having a relay input;
    (c) toggling said at least one relay to disconnect the relay input from a testing signal and connect said relay input to a known calibration reference source;
    (d) applying a known calibration reference signal from said known calibration reference source to said test probe, said known calibration reference source having an associated expected signal;
    (e) testing said known calibration reference signal applied to said test probe to obtain a measured signal;
    (f) comparing said measured signal with said expected signal, the difference between said measured signal and said expected signal being a measured error; and
    (g) providing compensation for said measured error.

19. The method of claim 18, said electrical test probe remaining connected to an electrical component under test throughout steps (c)–(g).

20. The method of claim 18, said electrical testing probe system performing said steps (c)–(g) as a self-calibration routine.

21. The method of claim 18 said step of providing compensation for said measured error further comprising the compensation step selected from the group consisting of:
    (a) amplifying said testing signal to compensate for said measured error;
    (b) creating a correction table of correction values and adding an appropriate value from said correction table to compensate for said measured error; and
    (c) compensating mathematically for said measured error.

22. The method of claim 18, further comprising the step of determining an input resistor error.

23. The method of claim 22, further comprising the step of providing compensation for said input resistor error.

24. The method of claim 18, further comprising the step of determining a testing instrument error.

25. The method of claim 24, further comprising the step of providing compensation for said testing instrument error.

26. The method of claim 18, said electrical testing probe system performing steps (c)–(g) in response to at least one condition selected from the group consisting of:
    (a) a test probe being connected to a testing instrument;
    (b) a test probe being disconnected to a testing instrument;
    (c) a testing instrument being turned on;
    (d) a testing instrument being turned off;
    (e) at regularly timed intervals;
    (f) when a instrument configuration changes;
    (g) upon an increase in temperature;
    (h) upon a decrease in temperature; and
    (i) upon a user's request.

27. A self-calibrating electrical testing probe system comprising:
    (a) a test probe;
    (b) calibration circuitry at least partially located in said test probe, said calibration circuitry comprising:
        (i) at least one input resistor;
        (ii) at least one relay; and
        (iii) at least one known calibration reference signal; and
    (c) said at least one relay having a first position and a second position:
        (i) said first position providing signal access to a testing signal from an electrical component under test; and
        (ii) said second position providing signal access to said known calibration reference signal;
    (d) wherein said test probe may be calibrated while it remains connected to said electrical component under test.

28. The system of claim 27 further comprising an error compensator.

29. The system of claim 28 wherein said error compensator toggles said at least one relay between said first and second positions to disconnect the relay input from a testing signal and connect the relay input to a known calibration reference source.

30. The system of claim 28 wherein said error compensator provides compensation for a measured error.

31. The system of claim 27 further comprising a testing instrument.

32. The system of claim 27, wherein said test probe is an active test probe, said calibration circuitry further comprising at least one amplifier.

33. The system of claim 27 wherein said at least one relay is functionally positioned behind said at least one input resistor.

34. The system of claim 27 wherein said at least one relay is functionally positioned in front of said at least one input resistor.

35. The system of claim 27 wherein said calibration reference voltage may be positioned in a location selected from the group consisting of:
    (a) said probing head;
    (b) said connector; and
    (c) said testing instrument.

36. The system of claim 27 wherein said electrical testing probe system may self-calibrate said test probe.

37. The system of claim 27 wherein said electrical testing probe system may self-calibrate said test probe in response to at least one condition selected from the group consisting of:
    (a) a test probe being connected to a testing instrument;
    (b) a test probe being disconnected to a testing instrument;
    (c) a testing instrument being turned on;
    (d) a testing instrument being turned off;
    (e) at regularly timed intervals;
    (f) when a instrument configuration changes;
    (g) upon an increase in temperature;
    (h) upon a decrease in temperature; and
    (i) upon a user's request.

* * * * *

UNITED STATES PATENT AND TRADEMARK OFFICE
CERTIFICATE OF CORRECTION

PATENT NO.   : 6,870,359 B1
DATED        : March 22, 2005
INVENTOR(S)  : Sekel

It is certified that error appears in the above-identified patent and that said Letters Patent is hereby corrected as shown below:

Column 5,
Line 51, "Turing" should read -- Turning --.

Column 6,
Line 2, "relay" should read -- relays --.
Line 41, "calibration reference voltage" should read -- "calibration reference voltage" --.

Column 9,
Line 22, "effected" should read -- affected --.

Column 10,
Line 17, "remains-connected" should read -- remains connected --.
Line 40, "Instead, the test probe 18" should read -- Instead, in the test probe 18 --.
Line 54, "and the expected is" should read -- and the expected signal is --.

Signed and Sealed this

Twenty-ninth Day of November, 2005

JON W. DUDAS
*Director of the United States Patent and Trademark Office*